(12) United States Patent
Lee et al.

(10) Patent No.: US 12,191,227 B2
(45) Date of Patent: Jan. 7, 2025

(54) HEAT DISSIPATING SUBSTRATE COMPRISING DIAMOND AND SEMICONDUCTOR INTEGRATED DEVICE INCLUDING THE SAME

(71) Applicant: ELECTRONICS AND TELECOMMUNICATIONS RESEARCH INSTITUTE, Daejeon (KR)

(72) Inventors: Hyung Seok Lee, Daejeon (KR); Sung-Bum Bae, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 298 days.

(21) Appl. No.: 17/518,511

(22) Filed: Nov. 3, 2021

(65) Prior Publication Data

US 2022/0189845 A1 Jun. 16, 2022

(30) Foreign Application Priority Data

Dec. 14, 2020 (KR) .......... 10-2020-0174167
Mar. 19, 2021 (KR) .......... 10-2021-0036125

(51) Int. Cl.
  *H01L 23/373* (2006.01)
  *H01L 21/48* (2006.01)
  *H01L 23/367* (2006.01)
(52) U.S. Cl.
  CPC ...... *H01L 23/3732* (2013.01); *H01L 21/4803* (2013.01); *H01L 23/3672* (2013.01)

(58) Field of Classification Search
  CPC .................................. H01L 23/3732
  USPC ........................................... 257/17
  See application file for complete search history.

(56) References Cited

U.S. PATENT DOCUMENTS

| | | | |
|---|---|---|---|
| 7,033,912 B2 | 4/2006 | Saxler | |
| 11,482,464 B2 | 10/2022 | Yoshitsugu et al. | |
| 2002/0113288 A1* | 8/2002 | Clevenger | H01L 23/3732 257/E23.105 |
| 2011/0140126 A1 | 6/2011 | Gaul | |
| 2013/0160806 A1 | 6/2013 | Park et al. | |
| 2013/0228893 A1 | 9/2013 | Zhong | |
| 2017/0170093 A1* | 6/2017 | Maples | H01L 21/4882 |
| 2019/0096782 A1 | 3/2019 | Lee et al. | |

FOREIGN PATENT DOCUMENTS

| | | |
|---|---|---|
| JP | 2009-076694 A | 4/2009 |
| JP | 2012-151392 A | 8/2012 |
| JP | 2017220512 A | 12/2017 |
| KR | 100137578 B1 | 2/1998 |
| KR | 20110066075 A | 6/2011 |
| KR | 10-1464081 B1 | 11/2014 |
| WO | 2020003436 A1 | 1/2020 |

* cited by examiner

*Primary Examiner* — Ajay Arora
(74) *Attorney, Agent, or Firm* — Rabin & Berdo, P.C.

(57) ABSTRACT

Provided is a heat dissipating substrate including a diamond substrate, wherein an upper portion of the diamond substrate has a concave-convex structure including recessed regions that are spaced apart from each other, and insulation patterns that fill the recessed regions. The insulation patterns include at least one of silicon carbide, silicon nitride, silicon oxide, aluminum nitride, and aluminum oxide.

18 Claims, 7 Drawing Sheets

HEAT DISSIPATING SUBSTRATE COMPRISING DIAMOND AND SEMICONDUCTOR INTEGRATED DEVICE INCLUDING THE SAME

CROSS-REFERENCE TO RELATED APPLICATIONS

This U.S. non-provisional patent application claims priority under 35 U.S.C. § 119 of Korean Patent Applications No. 10-2020-0174167, filed on Dec. 14, 2020, and No. 10-2021-0036125, filed on Mar. 19, 2021, the entire contents of which are hereby incorporated by reference.

BACKGROUND

The present disclosure herein relates to a heat dissipating substrate, a manufacturing method of the heat dissipating substrate, and a semiconductor integrated device including a semiconductor device integrated onto the heat dissipating substrate.

A gallium-nitride (GaN) semiconductor among nitride semiconductors has a wide bandgap property, and has a high electric intensity and a high electron mobility in comparison with silicon. Due to this, the gallium-nitride (GaN) semiconductor attracts attention as a semiconductor for a next-generation RF and electric power. The gallium-nitride (GaN) semiconductor may have an electron mobility reduced by a self-heating effect of the device during a high current and high frequency operation. This reduced electron mobility causes a phenomenon of reducing a current. The gallium-nitride (GaN) semiconductor device has an internal temperature that is exponentially dependent on the mean time to failure (MTTF). Thus, a technology of developing a material having a high thermal conductivity to effectively dissipate heat generated from the inside of the gallium-nitride (GaN) semiconductor device is required.

Since diamond has a high thermal conductivity and a low coefficient of thermal expansion (CTE), the diamond attracts attention as a heat dissipating material. In recent years, a method for depositing diamond using a chemical vapor deposition method has been developed. Thus, a deposition speed of diamond may be increased, and a large-area deposition of diamond may be performed.

SUMMARY

The present disclosure provides a heat dissipating substrate having a high thermal conductive property and an improved bonding property and a manufacturing method thereof.

The present disclosure also provides a semiconductor integrated device capable of improving performance and reliability of a semiconductor device.

The object of the present invention is not limited to the aforesaid, but other objects not described herein will be clearly understood by those skilled in the art from descriptions below.

An embodiment of the inventive concept provides a heat dissipating substrate including: a diamond substrate, wherein an upper portion of the diamond substrate has a concave-convex structure including recessed regions that are spaced apart from each other; and insulation patterns that fill the recessed regions. The insulation patterns include at least one of silicon carbide, silicon nitride, silicon oxide, aluminum nitride, and aluminum oxide.

In some embodiments, each of the recessed regions may extend from a top surface of the diamond substrate into the diamond substrate, and at least a portion of each of the insulation patterns may fill each of the recessed regions and be disposed in the diamond substrate.

In some embodiments, a top surface of each of the insulation patterns may be disposed at a height equal to or greater than that of the top surface of the diamond substrate.

In some embodiments, a distance between the top surface of each of the insulation patterns and the top surface of the diamond substrate may be equal to or greater than about 0 μm and equal to or less than about 10 μm.

In some embodiments, each of the insulation patterns may have a line shape extending in one direction, a polygonal shape, or a circular shape.

In an embodiment of the inventive concept, a method for manufacturing a heat dissipating substrate includes: providing a diamond substrate, wherein an upper portion of the diamond substrate has a concave-convex structure including recessed regions that are spaced apart from each other; forming an insulation layer, which fills the recessed regions, on a top surface of the diamond substrate; and forming insulation patterns that fill the recessed regions by planarizing the insulation layer. The insulation patterns include at least one of silicon carbide, silicon nitride, silicon oxide, aluminum nitride, and aluminum oxide.

In some embodiments, the providing of the diamond substrate may include: providing a semiconductor substrate, wherein an upper portion of the semiconductor substrate has a concave-convex structure including preliminary recessed regions that are spaced apart from each other; forming the diamond substrate, which fills the preliminary recessed regions, on a top surface of the semiconductor substrate; and removing the semiconductor substrate from the diamond substrate. The diamond substrate fills the preliminary recessed regions, and therefore the concave-convex structure of the semiconductor substrate may be transferred to the diamond substrate.

In some embodiments, the providing of the semiconductor substrate may include: forming mask patterns on the top surface of the semiconductor substrate; forming the preliminary recessed regions in the semiconductor substrate by etching the upper portion of the semiconductor substrate by using the mask patterns as an etching mask; and removing the mask patterns.

In some embodiments, the providing of the diamond substrate may include: forming the diamond substrate on a semiconductor substrate; removing the semiconductor substrate from the diamond substrate; forming mask patterns on the top surface of the diamond substrate; forming the recessed regions in the diamond substrate by etching the upper portion of the diamond substrate by using the mask patterns as an etching mask; and removing the mask patterns.

In some embodiments, the forming of the insulation patterns may include planarizing the insulation layer until the top surface of the diamond substrate is exposed.

In an embodiment of the inventive concept, a semiconductor integrated device includes: a heat dissipating substrate; first metal pads disposed on the heat dissipating substrate; and a semiconductor device integrated onto the heat dissipating substrate. The semiconductor device includes electrode pads bonded to the first metal pads. The heat dissipating substrate includes a diamond substrate and insulation patterns disposed on an upper portion of the diamond substrate and spaced apart from each other, and each of the first metal pads contacts a portion of top surfaces of corresponding insulation patterns of the insulation patterns and a top surface of the diamond substrate.

In some embodiments, the insulation patterns may include at least one of silicon carbide, silicon nitride, silicon oxide, aluminum nitride, and aluminum oxide.

In some embodiments, the semiconductor device may be a nitride semiconductor device, and the electrode pads may include a gate electrode pad, a source electrode pad, and a drain electrode pad of the nitride semiconductor device.

In some embodiments, the semiconductor device may be one of a nitride semiconductor device, a group III-V compound semiconductor device, a silicon-based semiconductor device, and an optical device.

In some embodiments, each of the top surfaces of the insulation patterns may be disposed at a height equal to or greater than that of the top surface of the diamond substrate.

In some embodiments, each of the insulation patterns may have a line shape extending in one direction, a polygonal shape, or a circular shape.

In some embodiments, the semiconductor integrated device of may further include: second metal pads disposed on the heat dissipating substrate; and metal wires configured to connect the first metal pads and the second metal pads. Each of the second metal pads and the metal wires may contact a portion of the top surfaces of corresponding insulation patterns of the insulation patterns and the top surface of the diamond substrate.

In some embodiments, each of the first metal pads, the second metal pads, and the metal wires may include at least one of Cr, Ti, Al, Au, Cu, W, Ni, and Pt.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Embodiments of the present invention will be described with reference to the accompanying drawings so as to sufficiently understand constitutions and effects of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. In addition, the sizes of the elements and the relative sizes between elements may be exaggerated for further understanding of the present invention.

Unless terms used in embodiments of the present invention are differently defined, the terms may be construed as meanings that are commonly known to a person skilled in the art. Hereinafter, the present invention will be described in detail by explaining preferred embodiments of the invention with reference to the attached drawings.

Figure 1:
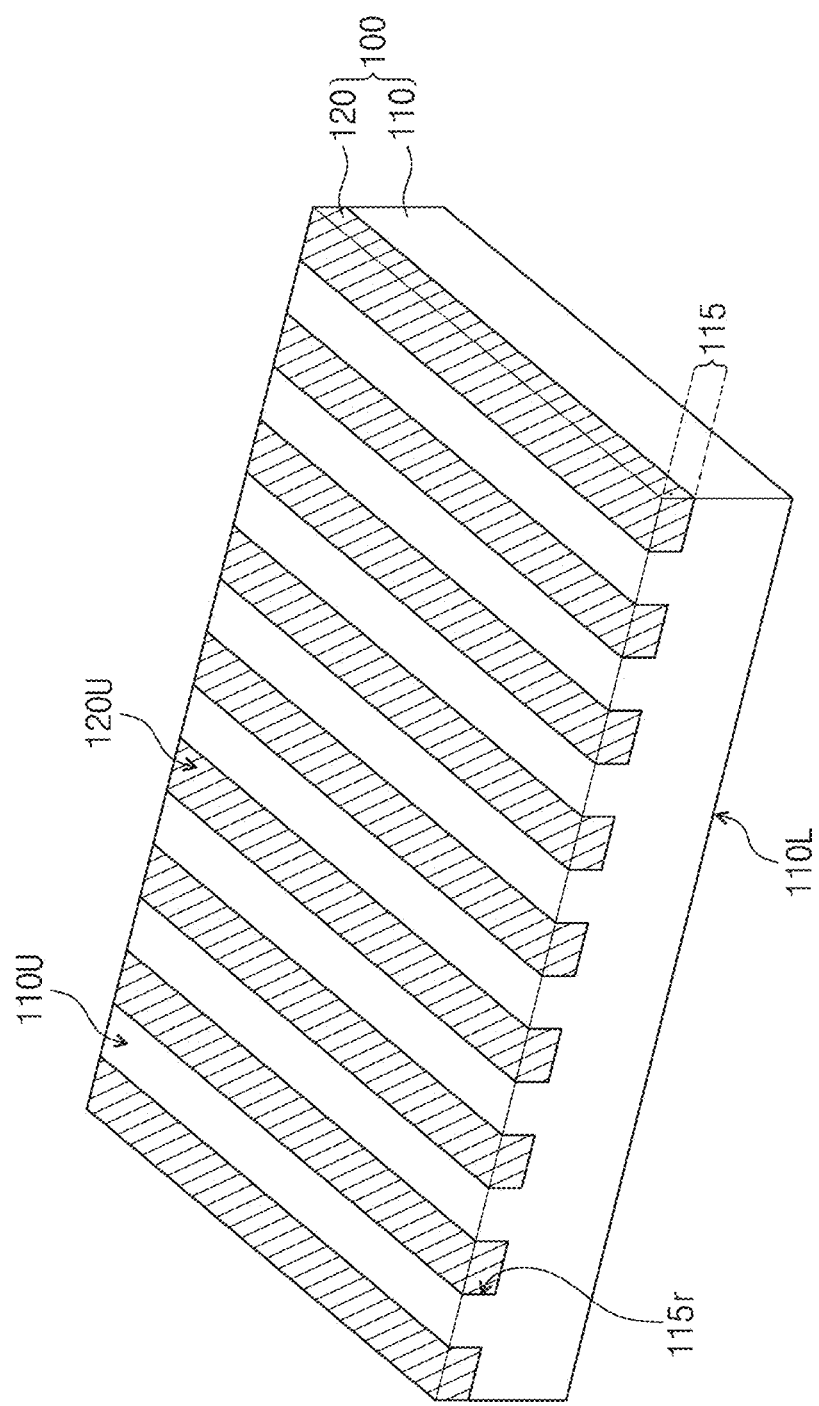
FIG. 1 is a perspective view illustrating a heat dissipating substrate according to some embodiments of the inventive concept.

FIG. 1 is a perspective view illustrating a heat dissipating substrate according to some embodiments of the inventive concept.

Referring to FIG. 1, a heat dissipating substrate 100 may include a diamond substrate 110 and insulation patterns 120 disposed on an upper portion of the diamond substrate 110 and spaced apart from each other. The upper portion of the diamond substrate 110 may have a concave-convex structure including recessed regions 115r that are spaced apart from each other. Each of the recessed regions 115r may extend from a top surface 110U of the diamond substrate 110 into the diamond substrate 110. For example, each of the recessed regions 115r may have a line shape extending in a direction parallel to the top surface 110U of the diamond substrate 110. However, the embodiment of the inventive concept is not limited thereto. Each of the recessed regions 115r may have various shapes such as a polygonal shape or a circular shape in terms of a plane.

The insulation patterns 120 may fill the recessed regions 115r. At least a portion of each of the insulation patterns 120 may fill each of the recessed regions 115r and be disposed in the diamond substrate 110. According to some embodiments, top surfaces 120U of the insulation patterns 120 may be coplanar with the top surface 110U of the diamond substrate 110. That is, the top surfaces 120U of the insulation patterns 120 may be disposed at the same height as the top surface 110U of the diamond substrate 110. In this specification, the height may be a distance measured from a bottom surface 110L of the diamond substrate 110. According to other embodiments, the top surfaces 120U of the insulation patterns 120 may be disposed at a height greater than the top surface 110U of the diamond substrate 110. For example, a distance between the top surface 120U of each of the insulation patterns 120 and the top surface 110U of the diamond substrate 110 may be equal to or greater than about 0 μm and equal to or less than about 10 μm.

For example, each of the insulation patterns 120 may have a line shape extending in a direction parallel to the top surface 110U of the diamond substrate 110. However, the embodiment of the inventive concept is not limited thereto. Each of the insulation patterns 120 may have various shapes such as a polygonal shape or a circular shape in terms of the plane.

The insulation patterns 120 may include an insulating material different from that of the diamond substrate 110. The insulation patterns 120 may include at least one of silicon carbide, silicon nitride, silicon oxide, aluminum nitride, and aluminum oxide.

According to an embodiment of the inventive concept, the heat dissipating substrate 100 may be a heterogeneous heat dissipating substrate including the diamond substrate 110 and the insulation patterns 120 disposed on the upper portion of the diamond substrate 110. Since the diamond substrate 110 has a high thermal conductivity, the heat dissipating substrate 100 may have a high thermal conductive property. In addition, the insulation patterns 120 may increase an adhesive force between the heat dissipating substrate 100 and metal pads disposed on the heat dissipating substrate 100, and thus the heat dissipating substrate 100 may have a strong adhesive force with the metal pads. Thus, the heat dissipating substrate having the strong adhesive force with the metal pads and simultaneously having the high thermal conductive property may be provided.

FIGS. 2A to 2D are cross-sectional views illustrating a method for manufacturing a heat dissipating substrate according to some embodiments of the inventive concept. Features overlapped with the heat dissipating substrate described with reference to FIG. 1 will be omitted for simplicity of description.

Figure 2A:
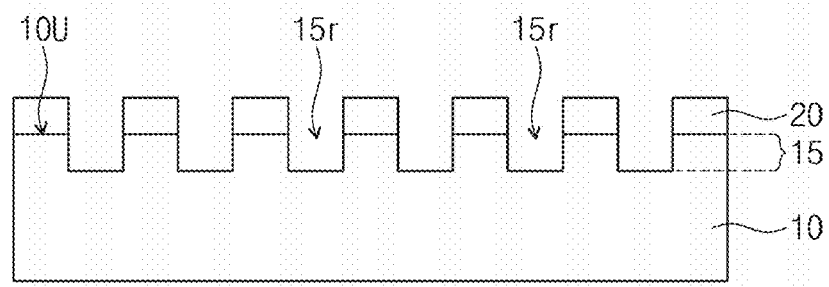
FIGS. 2A to 2D are cross-sectional views illustrating a method for manufacturing a heat dissipating substrate according to some embodiments of the inventive concept.

Referring to FIG. 2A, a semiconductor substrate 10 may be provided. For example, the semiconductor substrate 10 may be a silicon substrate. First mask patterns 20 may be disposed on the semiconductor substrate 10. For example, the first mask patterns 20 may be photoresist patterns. An upper portion of the semiconductor substrate 10 may be etched by using the first mask patterns 20 as an etching mask, and thus preliminary recessed regions 15r may be formed in the semiconductor substrate 10. The upper portion of the semiconductor substrate 10 may have a concave-convex structure 15 including the preliminary recessed regions 15r that are spaced apart from each other.

Each of the preliminary recessed regions 15r may extend from a top surface 10U of the semiconductor substrate 10 into the semiconductor substrate 10. For example, each of the preliminary recessed regions 15r may have a line shape extending in a direction parallel to the top surface 10U of the semiconductor substrate 10. However, the embodiment of the inventive concept is not limited thereto. Each of the preliminary recessed regions 15r may have various shapes such as a polygonal shape or a circular shape in terms of the plane.

After the preliminary recessed regions 15r are formed, the first mask patterns 20 may be removed. For example, the first mask patterns 20 may be removed by an ashing process and/or a stripping process.

Figure 2B:
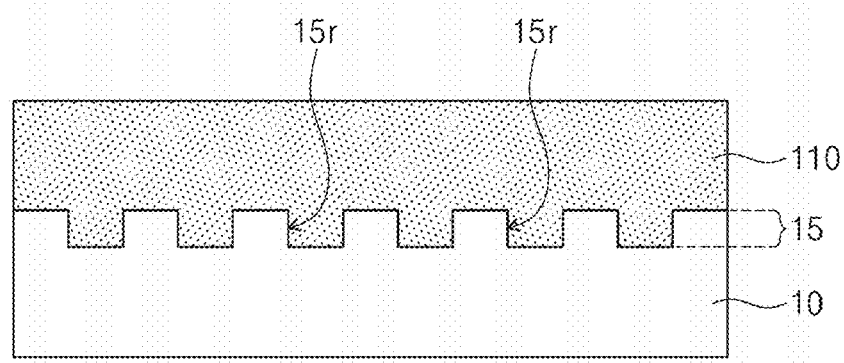

Referring to FIG. 2B, after the first mask patterns 20 are removed, the diamond substrate 110 may be formed on the top surface 10U of the semiconductor substrate 10. The diamond substrate 110 may cover the concave-convex structure 15 of the semiconductor substrate 10 and fill the preliminary recessed regions 15r. As the diamond substrate 110 fills the preliminary recessed regions 15r, the concave-convex structure 15 of the semiconductor substrate 10 may be transferred to the diamond substrate 110.

For example, the diamond substrate 110 may be deposited on the top surface 10U of the semiconductor substrate 10 by using a thermal chemical vapor deposition (CVD) method or a microwave CVD method. For example, the diamond substrate 110 may have a deposition temperature greater than about 500° C., e.g., in a range from about 700° C. to about 1000° C. The diamond substrate 110 may have a thickness of about 50 μm or more, preferably about 100 μm or more.

After the diamond substrate 110 is formed, the semiconductor substrate 10 may be removed from the diamond substrate 110. For example, the semiconductor substrate 10 may be removed by a wet etching process using a KOH etching solution.

Figure 2C:
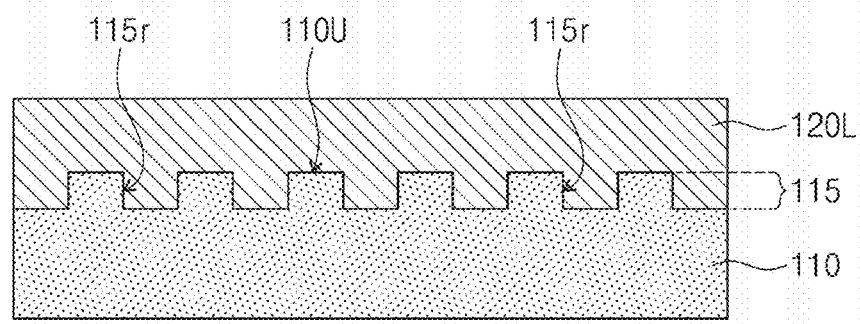

Referring to FIG. 2C, an upper portion of the diamond substrate 110 may have a concave-convex structure 115 including recessed regions 115r that are spaced apart from each other. The concave-convex structure 115 of the diamond substrate 110 may be transferred from the concave-convex structure 15 of the semiconductor substrate 10. Each of the recessed regions 115r may extend from a top surface 110U of the diamond substrate 110 into the diamond substrate 110. As described with reference to FIG. 1, for example, each of the recessed regions 115r may have a line shape extending in a direction parallel to the top surface 110U of the diamond substrate 110. However, the embodiment of the inventive concept is not limited thereto. Each of the recessed regions 115r may have various shapes such as a polygonal shape or a circular shape in terms of the plane.

An insulation layer 120L may be formed on the top surface 110U of the diamond substrate 110. The insulation layer 120L may cover the concave-convex structure 115 of the diamond substrate 110 and fill the recessed regions 115r. For example, the insulation layer 120L may be formed by a CVD method. The insulation layer 120L may include an insulating material different from that of the diamond substrate 110. The insulation layer 120L may include at least one of silicon carbide, silicon nitride, silicon oxide, aluminum nitride, and aluminum oxide. For example, the insulation layer 120L may include silicon carbide. In this case, the insulation layer 120L may be formed by a CVD method using silane ($SiH_4$) and propane ($C_3H_8$) as a precursor. The silicon carbide has a covalent bonding of Si and C, and the covalent bonding generally has a bonding strength greater than a metal bonding or the van der Waals force.

Figure 2D:
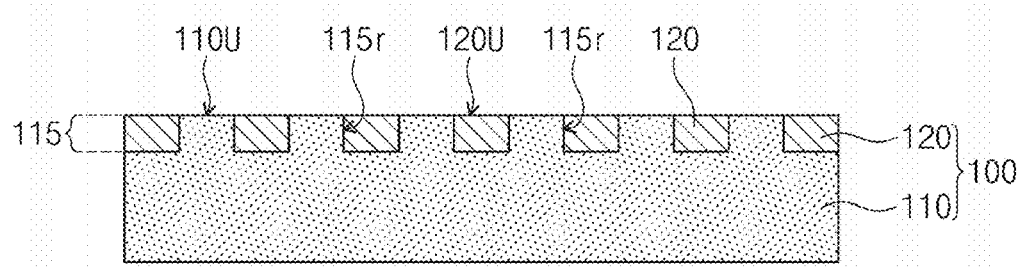

Referring to FIG. 2D, the insulation layer 120L may be planarized. For example, the insulation layer 120L may be planarized by a chemical mechanical polishing (CMP) process. According to some embodiments, the planarization of the insulation layer 120L may be performed until the top surface 110U of the diamond substrate 110 is exposed. As the insulation layer 120L is planarized, the insulation patterns 120 may be respectively formed in the recessed regions 115r of the diamond substrate 110.

According to some embodiments, top surfaces 120U of the insulation patterns 120 may form a coplanar surface with the top surface 110U of the diamond substrate 110. That is, the top surfaces 120U of the insulation patterns 120 may be disposed at the same height as the top surface 110U of the diamond substrate 110. According to other embodiments, the top surfaces 120U of the insulation patterns 120 may be disposed at a height greater than the top surface 110U of the diamond substrate 110.

As described with reference to FIG. 1, for example, each of the insulation patterns 120 may have a line shape extending in a direction parallel to the top surface 110U of the diamond substrate 110. However, the embodiment of the inventive concept is not limited thereto. Each of the insulation patterns 120 may have various shapes such as a polygonal shape or a circular shape in terms of the plane.

FIGS. 3A to 3D are cross-sectional views illustrating a method for manufacturing a heat dissipating substrate according to some embodiments of the inventive concept. Different points from the method for manufacturing the heat dissipating substrate described with reference to FIGS. 2A to 2D will be mainly described for simplicity of description.

Figure 3A:
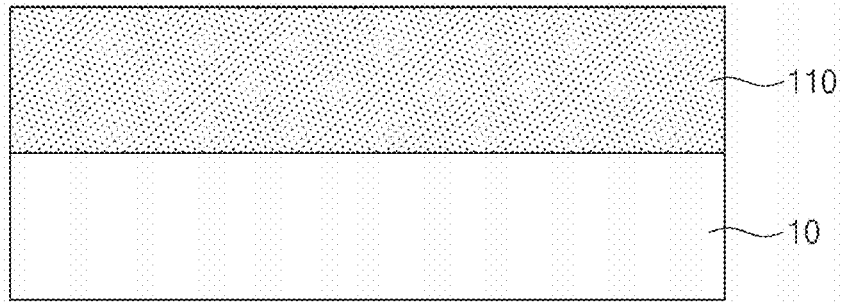
FIGS. 3A to 3D are cross-sectional views illustrating a method for manufacturing a heat dissipating substrate according to some embodiments of the inventive concept.

Referring to FIG. 3A, a semiconductor substrate 10 may be provided. For example, the semiconductor substrate 10 may be a silicon substrate. A diamond substrate 110 may be formed on the semiconductor substrate 10. For example, the diamond substrate 110 may be deposited on the semiconductor substrate 10 by using a thermal CVD method or a microwave CVD method. For example, the diamond substrate 110 may have a deposition temperature greater than about 500° C., e.g., in a range from about 700° C. to about 1000° C. The diamond substrate 110 may have a thickness of about 50 μm or more, preferably about 100 μm or more.

After the diamond substrate 110 is formed, the semiconductor substrate 10 may be removed from the diamond substrate 110. For example, the semiconductor substrate 10 may be removed by a wet etching process using a KOH etching solution.

Figure 3B:
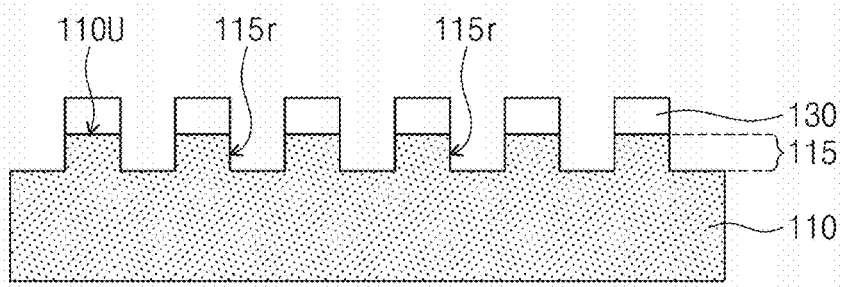

Referring to FIG. 3B, second mask patterns 130 may be formed on a top surface 110U of the diamond substrate 110. The second mask patterns 130 may include at least one of metal, silicon oxide, and silicon nitride. An upper portion of the diamond substrate 110 may be etched by using the second mask patterns 130 as an etching mask, and thus recessed regions 115r may be formed in the diamond substrate 110. For example, the etching of the upper portion of the diamond substrate 110 may include performing a plasma etching process using an etching gas including oxygen. For another example, the upper portion of the diamond substrate 110 may be etched by a laser process.

The upper portion of the diamond substrate 110 may have a concave-convex structure 115 including recessed regions 115r that are spaced apart from each other. Each of the recessed regions 115r may extend from the top surface 110U of the diamond substrate 110 into the diamond substrate 110. As described with reference to FIG. 1, for example, each of the recessed regions 115r may have a line shape extending in a direction parallel to the top surface 110U of the diamond substrate 110. However, the embodiment of the inventive concept is not limited thereto. Each of the recessed regions 115r may have various shapes such as a polygonal shape or a circular shape in terms of the plane.

After the preliminary recessed regions 15r are formed, the second mask patterns 130 may be removed. For example, the second mask patterns 130 may be removed by an ashing process and/or a stripping process.

Figure 3C:
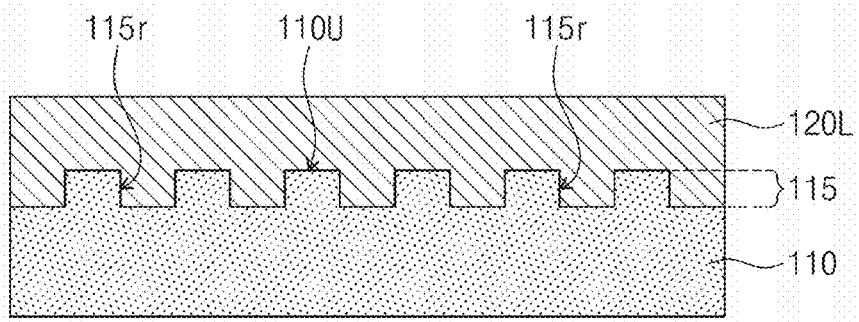

Referring to FIG. 3C, after the second mask patterns 130 are removed, an insulation layer 120L may be formed on the top surface 110U of the diamond substrate 110. The insulation layer 120L may cover the concave-convex structure 115 of the diamond substrate 110 and fill the recessed regions 115r. The insulation layer 120L may be formed by the substantially same method as the method described with reference to FIG. 2C.

Figure 3D:
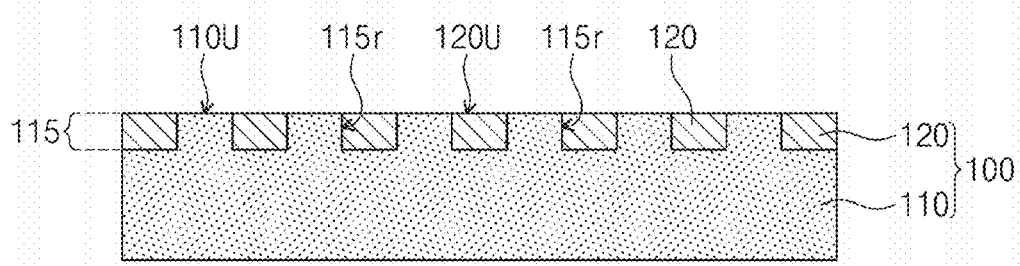

Referring to FIG. 3D, the insulation layer 120L may be planarized. For example, the insulation layer 120L may be planarized by a chemical mechanical polishing (CMP) process. According to some embodiments, the planarization of the insulation layer 120L may be performed until the top surface 110U of the diamond substrate 110 is exposed. As the insulation layer 120L is planarized, the insulation patterns 120 may be respectively formed in the recessed regions 115r of the diamond substrate 110.

As described with reference to FIG. 2D, top surfaces 120U of the insulation patterns 120 may be disposed at the same height as or at a height greater than the top surface 110U of the diamond substrate 110. As described with reference to FIG. 1, for example, each of the insulation patterns 120 may have a line shape extending in a direction parallel to the top surface 110U of the diamond substrate 110. However, the embodiment of the inventive concept is not limited thereto. Each of the insulation patterns 120 may have various shapes such as a polygonal shape or a circular shape in terms of the plane.

Figure 4:
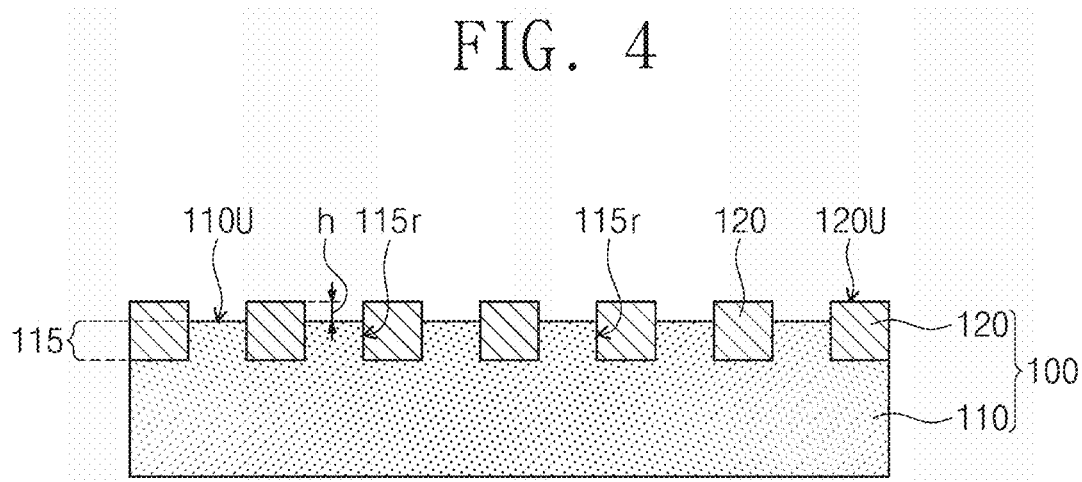
FIG. 4 is a cross-sectional view illustrating a heat dissipating substrate according to some embodiments of the inventive concept.

FIG. 4 is a cross-sectional view illustrating a heat dissipating substrate according to some embodiments of the inventive concept.

Referring to FIG. 4, top surfaces 120U of insulation patterns 120 may be disposed at a height greater than a top surface 110U of a diamond substrate 110. According to some embodiments, each of the insulation patterns 120 may have a shape protruding from the top surface 110U of the diamond substrate 110. Each of the insulation patterns 120 may have a lower portion filling each of recessed regions 115r and an upper portion protruding further than the top surface 110U of the diamond substrate 110. According to the embodiments, a distance h between the top surface 120U of each of the insulation patterns 120 and the top surface 110U of the diamond substrate 110 may be greater than about 0 μm and equal to or less than about 10 μm.

Except for the above-described different points, the heat dissipating substrate 100 according to the embodiments of the inventive concept is substantially the same as the heat dissipating substrate 100 described with reference to FIG. 1.

Figure 5:
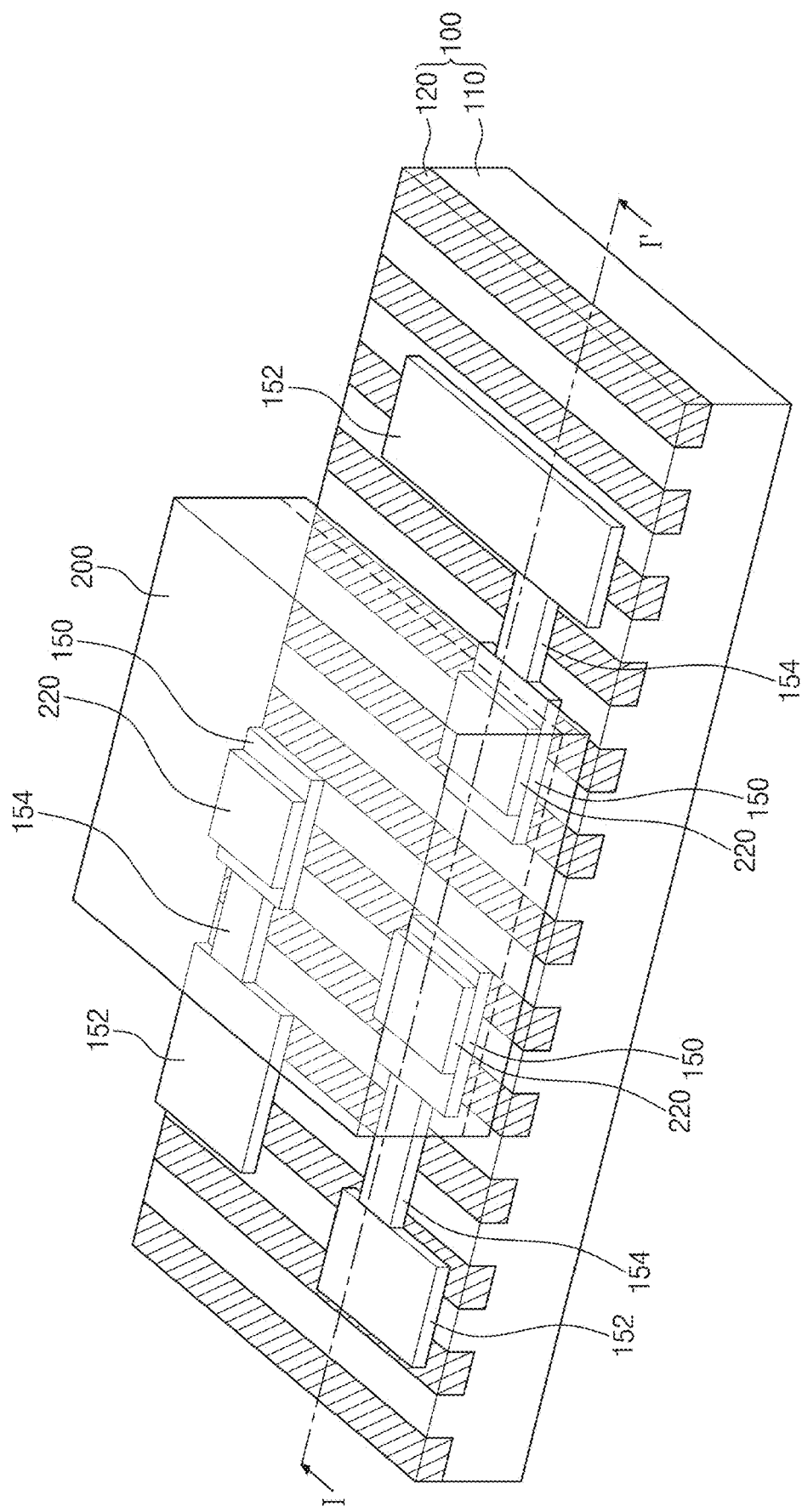
FIG. 5 is a perspective view illustrating a semiconductor integrated device according to some embodiments of the inventive concept.
Figure 6:
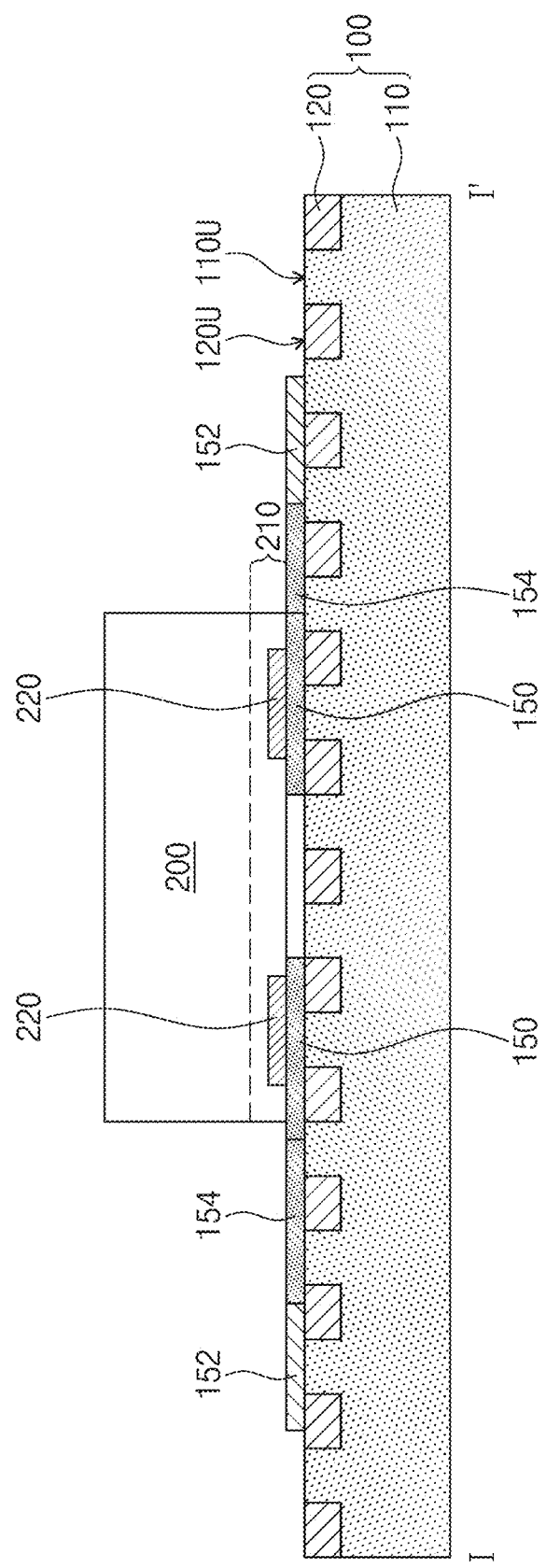
FIG. 6 is a cross-sectional view taken along line I-I' of FIG. 5.

FIG. 5 is a perspective view illustrating a semiconductor integrated device according to some embodiments of the inventive concept, and FIG. 6 is a cross-sectional view taken along line I-I' of FIG. 5.

Referring to FIGS. 5 and 6, a semiconductor device 200 may be integrated on a heat dissipating substrate 100. The heat dissipating substrate 100 may include a diamond substrate 110 and insulation patterns 120 disposed on an upper portion of the diamond substrate 110 and spaced apart from each other. The heat dissipating substrate 100 may be substantially the same as the heat dissipating substrate 100 according to the embodiments of the inventive concept described with reference to FIGS. 1 to 4.

First metal pads 150, second metal pads 152, and metal wires 154 connecting the first metal pads 150 and the second metal pads 152 may be disposed on the heat dissipating substrate 100. For example, the first metal pads 150, the second metal pads 152, and the metal wires 154 may be provided by forming a metal layer on the heat dissipating substrate 100 and then patterning the metal layer. Each of the first metal pads 150, the second metal pads 152, and the metal wires 154 may include at least one of Cr, Ti, Al, Au, Cu, W, Ni, and Pt.

Each of the first metal pads 150, the second metal pads 152, and the metal wires 154 may contact a portion of top surfaces 120U of corresponding insulation patterns 120 among the insulation patterns 120 and a top surface 110U of the diamond substrate 110. According to embodiments of the inventive concept, as the heat dissipating substrate 100 includes the insulation patterns 120, an adhesive force between the heat dissipating substrate 100 and each of the first metal pads 150, the second metal pads 152, and the metal wires 154 may increase.

The semiconductor device 200 may include electrode pads 220 disposed adjacent to one surface of the semiconductor device 200. The electrode pads 220 may include a conductive material. The electrode pads 220 may be bonded to the first metal pads 150, respectively. For example, the electrode pads 220 may directly bonded to the first metal pads 150, respectively. For another example, an additional bump may be disposed between each of the electrode pads 220 and each of the first metal pads 150, and each of the electrode pads 220 may be bonded to each of the first metal pads 150 through the additional bump. For example, the additional bump may include silver (Au) and tin (Sn). For another example, the additional bump may be a solder bump.

The semiconductor device 200 may be one of a nitride semiconductor device, a group III-V compound semiconductor device, a silicon-based semiconductor device, and an optical device. According to some embodiments, the semiconductor device 200 may be a nitride semiconductor device (e.g., a GaN semiconductor device) including a nitride layer 210 (e.g., a GaN layer) disposed adjacent to one surface of the semiconductor device 200. The electrode pads 220 may include a gate electrode pad, a source electrode pad, and a drain electrode pad of the nitride semiconductor device.

The first metal pads 150 may be bonded to the electrode pads 220 of the semiconductor device 200, and the metal wires 154 may connect the first metal pads 150 to the second metal pads 152. Additional devices may be connected to the second metal pads 152 through wiring.

According to embodiments of the inventive concept, as the heat dissipating substrate 100 includes the diamond substrate 110, heat generated from the semiconductor device 200 may be easily dissipated through the diamond substrate 110. Thus, the semiconductor device 200 may have improved performance and reliability. In addition, as the heat dissipating substrate 100 includes the insulation patterns 120, an adhesive force between the heat dissipating substrate 100 and each of the first metal pads 150, the second metal pads 152, and the metal wires 154 may increase.

Table 1 below shows a result of a shear test of the heat dissipating substrate 100 according to embodiments of the inventive concept and a typical PCB board.

TABLE 1

| Classification | Horizontal length [μm] | Vertical length [μm] | Area [μm²] | Measured value [gf] | [MPa] |
|---|---|---|---|---|---|
| PCB board | 1327 | 789 | 1047003 | 210 | 1.97 |
| Heat dissipating substrate | 1343 | 779 | 976796 | 640 | 6.43 |

Referring to table 1, it may be found that the heat dissipating substrate 100 according to embodiments of the inventive concept has a tensile strength and a shear strength greater than those of the typical PCB board.

Figure 7:
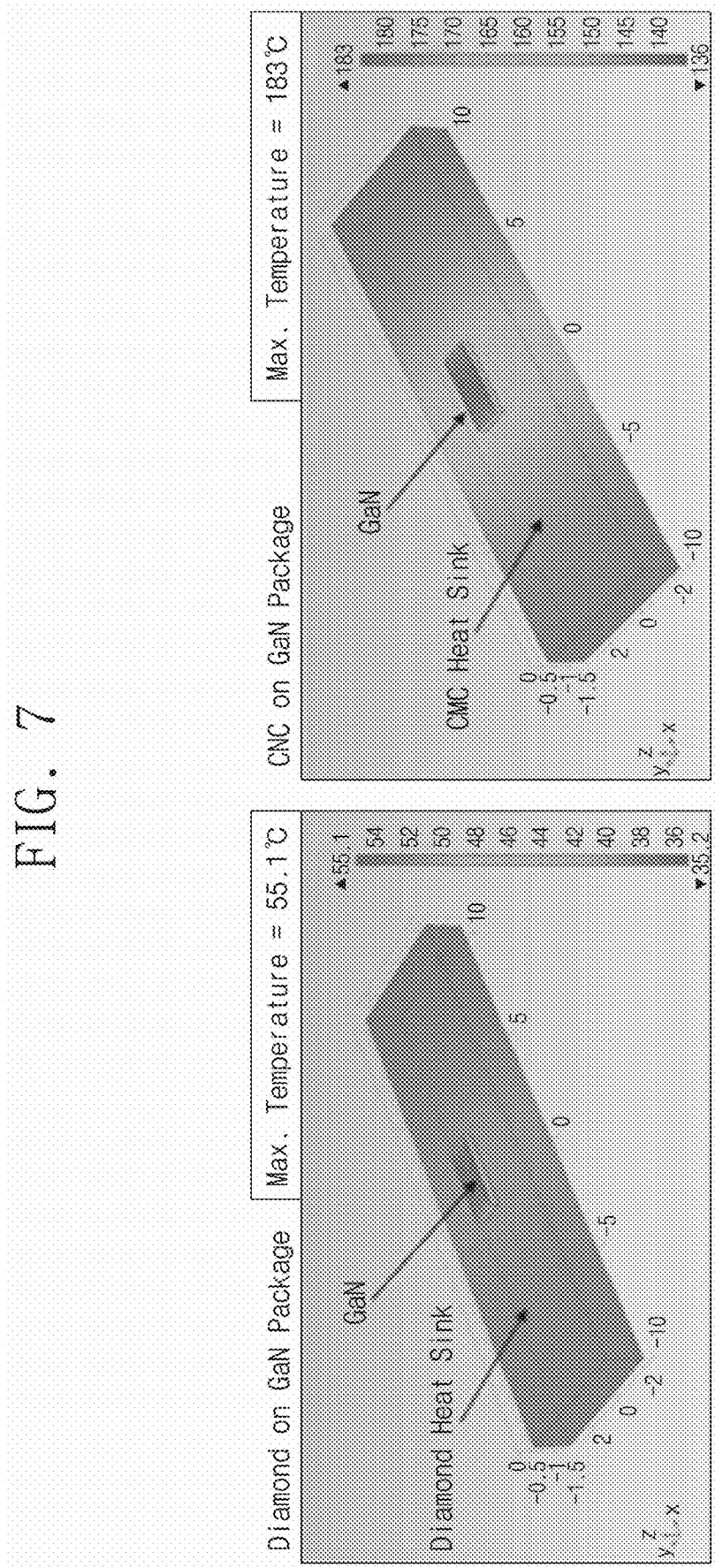
FIG. 7 is a graph showing a result of a thermal simulation of the heat dissipating substrate according to embodiments of the inventive concept and a typical heat dissipation substrate.

FIG. 7 is a graph showing a result of a thermal simulation of the heat dissipating substrate 100 according to embodiments of the inventive concept and a typical heat dissipation substrate.

Referring to FIG. 7, a semiconductor device (a GaN semiconductor device) integrated onto the heat dissipating substrate 100 according to embodiments of the inventive concept has a maximum temperature of about 55.1° C., and a semiconductor device (a GaN semiconductor device) integrated onto the typical heat dissipation substrate has a maximum temperature of about 183° C. That is, it may be found that the heat dissipating substrate 100 according to embodiments of the inventive concept easily dissipate heat generated from the semiconductor device (the GaN semiconductor device).

According to an embodiment of the inventive concept, the heat dissipating substrate 100 may be the heterogeneous heat dissipating substrate including the diamond substrate 110 and the insulation patterns 120 disposed on the upper portion of the diamond substrate 110. Since the diamond substrate 110 has the high thermal conductivity, the heat dissipating substrate 100 may have the high thermal conductive property. In addition, the insulation patterns 120 may increase the adhesive force between the heat dissipation substrate 100 and each of the metal pads 150 and 152 and the metal wires 154 disposed on the heat dissipation substrate 100. Thus, the heat dissipating substrate having the strong adhesive force with the metal pads and simultaneously having the high thermal conductive property may be provided.

In addition, as the heat dissipating substrate 100 includes the diamond substrate 110, the heat generated from the semiconductor device 200 may be easily dissipated through the heat dissipating substrate 100. Thus, the semiconductor integrated device capable of improving performance and high temperature reliability of the semiconductor device may be provided.

According to the embodiment of the inventive concept, the heat dissipating substrate may be the heterogeneous heat dissipating substrate including the diamond substrate and the insulation patterns disposed on the upper portion of the diamond substrate. Since the diamond substrate has the high thermal conductivity, the heat dissipating substrate may have the high thermal conductive property. In addition, the insulation patterns may increase the adhesive force between the heat dissipating substrate and the metal pads disposed on the heat dissipating substrate. Thus, the heat dissipating substrate having the strong adhesive force with the metal pads and simultaneously having the high thermal conductive property and the manufacturing method thereof may be provided.

Furthermore, as the heat dissipating substrate includes the diamond substrate, the heat generated from the semiconductor device integrated onto the heat dissipating substrate may be easily dissipated through the heat dissipating substrate. Thus, the semiconductor integrated device capable of improving the performance and the high temperature reliability of the semiconductor device may be provided.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A heat dissipating substrate comprising:
   a diamond substrate, wherein an upper portion of the diamond substrate has a concave-convex structure including recessed regions that are spaced apart from each other; and
   insulation patterns that fill the recessed regions, bottom surfaces and side surfaces of the insulation patterns being in contact with the diamond substrate,
   wherein the insulation patterns include at least one of silicon carbide, silicon nitride, silicon oxide, aluminum nitride, and aluminum oxide.

2. The heat dissipating substrate of claim 1, wherein each of the recessed regions extends from a top surface of the diamond substrate into the diamond substrate, and
   at least a portion of each of the insulation patterns fills each of the recessed regions and is disposed in the diamond substrate.

3. The heat dissipating substrate of claim 2, wherein a top surface of each of the insulation patterns is disposed at a height equal to or greater than that of the top surface of the diamond substrate.

4. The heat dissipating substrate of claim 3, wherein a distance between the top surface of each of the insulation patterns and the top surface of the diamond substrate is equal to or greater than about 0 μm and equal to or less than about 10 μm.

5. The heat dissipating substrate of claim 1, wherein each of the insulation patterns has a line shape extending in one direction, a polygonal shape, or a circular shape.

6. A method for manufacturing a heat dissipating substrate, comprising:
providing a diamond substrate, wherein an upper portion of the diamond substrate has a concave-convex structure including recessed regions that are spaced apart from each other;
forming an insulation layer, which fills the recessed regions, on a top surface of the diamond substrate; and
forming insulation patterns that fill the recessed regions by planarizing the insulation layer,
wherein bottom surfaces and side surfaces of the insulation patterns are in contact with the diamond substrate, and
wherein the insulation patterns include at least one of silicon carbide, silicon nitride, silicon oxide, aluminum nitride, and aluminum oxide.

7. The method of claim 6, wherein the providing of the diamond substrate comprises:
providing a semiconductor substrate, wherein an upper portion of the semiconductor substrate has a concave-convex structure including preliminary recessed regions that are spaced apart from each other;
forming the diamond substrate, which fills the preliminary recessed regions, on a top surface of the semiconductor substrate; and
removing the semiconductor substrate from the diamond substrate,
wherein as the diamond substrate fills the preliminary recessed regions, the concave-convex structure of the semiconductor substrate is transferred to the diamond substrate.

8. The method of claim 7, wherein the providing of the semiconductor substrate comprises:
forming mask patterns on the top surface of the semiconductor substrate;
forming the preliminary recessed regions in the semiconductor substrate by etching the upper portion of the semiconductor substrate by using the mask patterns as an etching mask; and
removing the mask patterns.

9. The method of claim 6, wherein the providing of the diamond substrate comprises:
forming the diamond substrate on a semiconductor substrate;
removing the semiconductor substrate from the diamond substrate;
forming mask patterns on the top surface of the diamond substrate;
forming the recessed regions in the diamond substrate by etching the upper portion of the diamond substrate by using the mask patterns as an etching mask; and
removing the mask patterns.

10. The method of claim 6, wherein the forming of the insulation patterns comprises planarizing the insulation layer until the top surface of the diamond substrate is exposed.

11. A semiconductor integrated device comprising:
a heat dissipating substrate;
first metal pads disposed on the heat dissipating substrate; and
a semiconductor device integrated onto the heat dissipating substrate,
wherein the semiconductor device includes electrode pads bonded to the first metal pads,
the heat dissipating substrate includes a diamond substrate and insulation patterns disposed on an upper portion of the diamond substrate and spaced apart from each other, and
each of the first metal pads contacts top surfaces of corresponding insulation patterns of the insulation patterns and a top surface of the diamond substrate.

12. The semiconductor integrated device of claim 11, wherein the insulation patterns include at least one of silicon carbide, silicon nitride, silicon oxide, aluminum nitride, and aluminum oxide.

13. The semiconductor integrated device of claim 11, wherein the semiconductor device is a nitride semiconductor device, and
the electrode pads comprise a gate electrode pad, a source electrode pad, and a drain electrode pad of the nitride semiconductor device.

14. The semiconductor integrated device of claim 11, wherein the semiconductor device is one of a nitride semiconductor device, a group III-V compound semiconductor device, a silicon-based semiconductor device, and an optical device.

15. The semiconductor integrated device of claim 11, wherein each of the top surfaces of the insulation patterns is disposed at a height equal to or greater than that of the top surface of the diamond substrate.

16. The semiconductor integrated device of claim 11, wherein each of the insulation patterns has a line shape extending in one direction, a polygonal shape, or a circular shape.

17. The semiconductor integrated device of claim 11, further comprising:
second metal pads disposed on the heat dissipating substrate; and
metal wires configured to connect the first metal pads and the second metal pads,
wherein each of the second metal pads and the metal wires contacts top surfaces of corresponding insulation patterns of the insulation patterns and the top surface of the diamond substrate.

18. The semiconductor integrated device of claim 17, wherein each of the first metal pads, the second metal pads, and the metal wires comprises at least one of Cr, Ti, Al, Au, Cu, W, Ni, and Pt.

* * * * *